United States Patent [19]

Johnston et al.

[11] Patent Number: 4,819,049
[45] Date of Patent: Apr. 4, 1989

[54] METHOD OF FABRICATING HIGH VOLTAGE AND LOW VOLTAGE TRANSISTORS USING AN EPITAXIAL LAYER OF UNIFORM THICKNESS

[75] Inventors: Roger E. Johnston, Hillsboro; Alex Y. Tang, Aloha, both of Oreg.

[73] Assignee: Tektronix, Inc., Beaverton, Oreg.

[21] Appl. No.: 203,593

[22] Filed: Jun. 2, 1988

Related U.S. Application Data

[63] Continuation of Ser. No. 776,317, Sep. 16, 1985, abandoned.

[51] Int. Cl.$^4$ .............................................. H01L 27/02
[52] U.S. Cl. .................................. 357/40; 357/34; 357/48; 357/49; 357/50; 357/52
[58] Field of Search ...................... 357/34, 40, 48, 49, 357/50, 52

[56] References Cited

U.S. PATENT DOCUMENTS 3,933,540  1/1976  Kondo et al. ....................... 148/187
4,536,784  8/1985  Nagumo et al. ..................... 357/48
4,573,256  3/1986  Lechaton et al. .................... 357/34

FOREIGN PATENT DOCUMENTS 56-90554  7/1981  Japan .

Primary Examiner—Edward J. Wojciechowicz
Attorney, Agent, or Firm—John Smith-Hill; William S. Lovell

[57] ABSTRACT

An integrated circuit structure comprises a body of semiconductor material and first and second transistors formed in a surface region of the body. The body of semiconductor material comprises a substrate of silicon doped with a p-type impurity and an epitaxial layer of silicon over predetermined surface regions of the substrate. The epitaxial layer is of substantially uniform thickness. Each transistor comprises a base, an emitter and an active collector formed in the epitaxial layer, and a subcollector formed in the substrate and extending beneath the base and the active collector of the transistor. The second transistor comprises, in addition, a contact collector formed in the epitaxial layer and laterally spaced from the base and the emitter of the second transistor. The subcollector of the second transistor extends beneath the contact collector and contains a lower concentration of impurity than the subcollector of the first transistor, and the contact collector of the second transistor is formed in a region of the epitaxial layer that is separate from the region in which the base and emitter of the second transistor are formed.

7 Claims, 2 Drawing Sheets

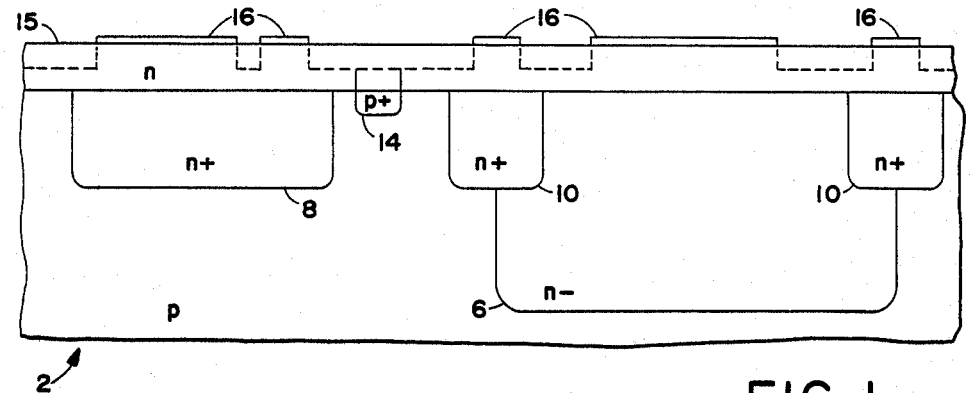
FIG. 1.
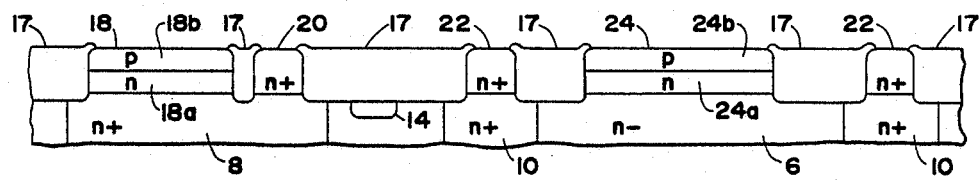
FIG. 2A.
FIG. 2B.
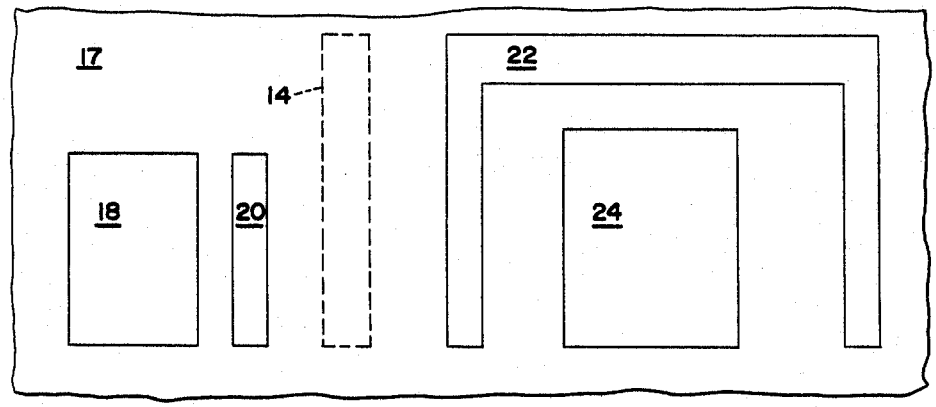

METHOD OF FABRICATING HIGH VOLTAGE AND LOW VOLTAGE TRANSISTORS USING AN EPITAXIAL LAYER OF UNIFORM THICKNESS

This is a continuation of application Ser. No. 776,317 filed Sept. 16, 1985 and now abandoned.

This invention relates to a method of fabricating both high voltage and low voltage transistors using an epitaxial layer of uniform thickness.

BACKGROUND OF THE INVENTION

In the manufacture of NPN bipolar transistors at large-scale integration, it is conventional to form a buried layer of n-type material within the p-type substrate, to serve as a subcollector, and to form the base, the emitter and the collector in an epitaxial layer that is deposited on the substrate over the subcollector. A heavily-doped contact collector penetrates through the lightly-doped collector region of the epitaxial layer and is contiguous with the subcollector. The breakdown current path from the base to the contact collector is through the lightly-doped (high resistivity) active collector region of the epitaxial layer and the heavily-doped (low resistivity) subcollector. Therefore, the base-to-collector breakdown voltage $BV_{CBO}$ of this transistor depends on the doping level of the epitaxial layer, the depth of the subcollector beneath the active base region of the device, and the thickness of the epitaxial layer. Clearly, this presents a problem in the event that it is desired to integrate both high voltage and low voltage devices on the same substrate, since it implies that a thicker epitaxial layer is required for the high voltage device than for the low voltage device, and this in turn implies that additional fabrication steps must be performed.

SUMMARY OF THE INVENTION

In a preferred embodiment of one aspect of the invention, an integrated circuit structure comprises a body of semiconductor material and at least first and second transistors formed in a surface region of the body. The body of semiconductor material comprises a substrate of silicon doped with a p-type impurity and an epitaxial layer of silicon over selected portions of the substrate. The epitaxial layer is of substantially uniform thickness. The first transistor comprises a base, an emitter and a collector formed in the epitaxial layer, and a subcollector formed in the substrate and extending beneath the base and collector of the first transistor. The second transistor comprises a base, an emitter and an active collector formed in the epitaxial layer, a contact collector formed in the epitaxial layer and laterally spaced from the base and the emitter, and a subcollector formed in the substrate beneath the base, the collector and the contact collector of the second transistor. The subcollector of the second transistor contains a lower concentration of impurity than the subcollector of the first transistor, and the contact collector of the second transistor is formed in a region of the epitaxial layer that is separate from the region in which the base and emitter of the second transistor are formed.

BRIEF DESCRIPTION OF THE DRAWINGS

For a better understanding of the invention, and to show how the same may be carried into effect, reference will now be made, by way of example, to the accompanying drawings in which:

FIG. 1 is a sectional view of an integrated circuit structure at a first stage in fabrication, FIGS. 2A and 2B, are respectively, a sectional view and a plan view of the integrated circuit structure at a second, later, stage in fabrication.

DETAILED DESCRIPTION

Figure 3A:
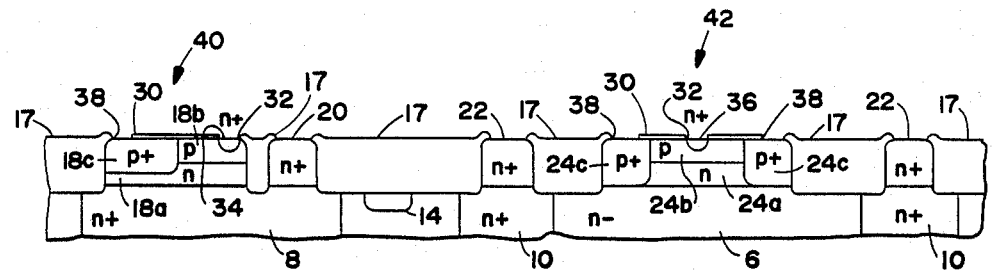
FIGS. 3A and 3B are views similar to FIGS. 2A and 2B at a third, still later, stage in fabrication of the structure.

FIG. 1 shows a substrate 2 of silicon that has been doped with a p-type impurity such as boron to a concentration such as to provide a resistivity of 10–50 Ωcm. A highly mobile n-type impurity, such as phosphorus, is implanted into a defined region of the surface of the substrate and is then diffused into the bulk of the substrate to a depth of about 10 μm so as to form a relatively large but lightly doped region 6. The doping concentration and resistivity vary substantially with depth in the region 6, but typically the region 6 has, near its surface, a carrier concentration of about $10^{15}$ cm$^{-3}$ and a resistivity of about 2 Ωcm (about 1000 Ω/sq). The depth of the region 6 is about 10 μm. A less mobile n-type impurity, such as arsenic or antimony, is then implanted into three separate regions of the surface of the substrate and is diffused for a short time so as to form two smaller and highly doped regions 8 and 10 having a depth of about 2–4 μm, a carrier concentration of about $10^{19}$–$10^{20}$ cm$^{-3}$ near the surface, and a resistivity in plan, the two limbs of the U being at the opposite site lateral boundaries of the region 6. The region 8 is outside the region 6.

An n-type layer 15 of silicon about 1.5 μm thick and having a conductivity of about 0.2–1.0 Ω-cm is deposited epitaxially over the surface of the substrate, burying the regions 6–14. Using conventional deposition and masking techniques, a thin layer 16 of silicon nitride is deposited over the surface of the epitaxial layer and is then etched to expose predetermined surface regions of the expitaxial layer 15. The epitaxial layer is etched through its exposed surface regions to a depth of about 0.8 μm, as shown by dashed lines in FIG. 1.

A p-type impurity, such as boron, is implanted into a region of the surface of the epitaxial layer that is between the regions 8 and 10, and is diffused to form a highly doped region 14 having a depth, below the epitaxial layer, of about 1–2 μm. The substrate is then placed in a high pressure oxidation furnace to grow a layer of silicon dioxide 17 (FIG. 2) in those areas that are not masked by the silicon nitride. The silicon dioxide penetrates right through the epitaxial layer into the substrate, and thus provides dielectric isolation between the regions 18, 20, 22 and 24 of the epitaxial layer. It will be appreciated that the silicon nitride does not completely prevent formation of silicon dioxide beneath the layer 16, and a so-called bird's beak of silicon dioxide will penetrate beneath the layer 16 by virtue of lateral growth of the oxide layer. The silicon nitride layer 16 is then removed.

The regions 18 and 24 are then masked, and an n-type impurity such as phosphorus is implanted into the regions 20 and 22. The regions 20 and 22 are masked and a p-type impurity such as boron is implanted into the regions 18 and 24. Accordingly, in the regions 18 and 24 the epitaxial layer comprises a lower zone 18a, 24a of n-type material and an upper zone 18b, 24b of p-type material.

One side of the region 18 is masked and a central strip of the region 24 is masked and a p-type impurity is implanted into the exposed zones 18c and 24c (FIG. 3) of the regions 18 and 24 respectively. A thin layer 30 of oxide is grown over the regions 18 and 24, and openings 32 are formed by conventional selective etching techniques. An n-type impurity is implanted into zones 34 and 36 of the expitaxial layer through the openings 32 and then further openings 38 are cut in the layer 30 to expose the zones 18c and 24c. Metal (not shown) is deposited to establish ohmic contact with the zones 18c, 24c, 34 and 36 and the regions 20 and 22. The silicon dioxide of the layer 30 that has not previously been removed by formation of the openings 32 and 38 is used as a passivation layer, preventing contact between the metallization and the zones 18b and 24b.

Figure 3B:
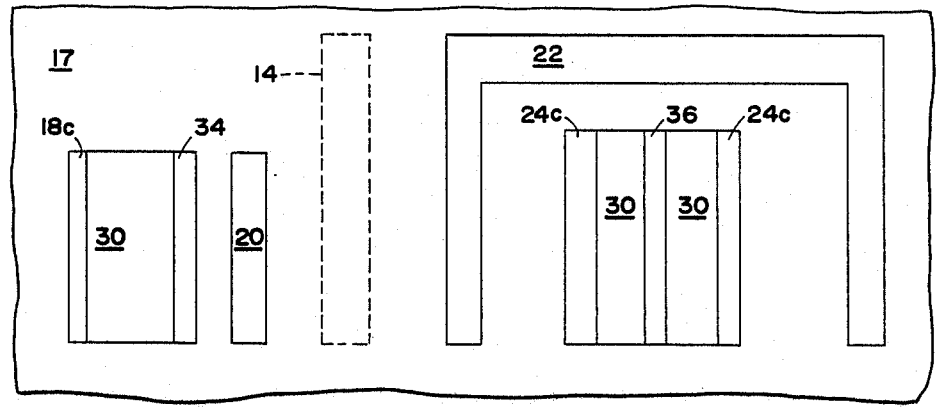

The device shown in FIG. 3 comprises first and second transistors 40 and 42. The transistor 40 has an emitter 34, an active base 18b, a base contact zone 18c, an active collector 18a, a subcollector 8 and a collector contact region 20, while the transistor 42 has an emitter 36, an active base 24b, base contact zones 24c, an active collector (epitaxial zone 24a plus subcollector (6) and a collector contact region 10, 22. The subcollector 8 of the transistor 40 is not considered to be part of the active collector of that transistor because its high impurity concentration prevents it from being depleted of charge carriers.

The first transistor 40 has a relatively low collector-to-base breakdown voltage $BV_{CBO}$, whereas the second transistor 42 has a higher value of $BV_{CBO}$. The increased value of $BV_{CBO}$ for the transistor 42 arises without the need for a thicker epitaxial layer beneath the zone 24b than the zone 18b, because the collector contact region 22 is spaced by dielectric isolation from the active region of the transistor (the emitter 36 and the zones 24a and 24b), and the current path between the base and the collector contact region tranverses the lightly-doped subcollector 6. The subcollector 6 thus serves the purpose of the thick, lightly-doped epitaxial layer in the known high-voltage transistor. Moreover, the heavily-doped region 14 serves as a channel stop between the regions 8 and 10, providing good isolation of the collectors of the two transistors.

The breakdown voltage $BV_{CBO}$ of the transistor 42 depends on the depth of the zones 24c, the curvature of the boundaries of the zones 24c, the thickness and resistivity of the zone 24a, the lateral spacing between the zone 24c and the region 10, and the doping concentration of the region 6. In general, a higher breakdown voltage can be obtained by increasing the radius of curvature of the boundaries of the zones 24c, by increasing the depth of the zones 24c. A higher breakdown voltage for the transistor 42 can also be obtained by reducing the thickness and the doping concentration of the zone 24a. Typically, the zone 24a has a thickness of 0.5–2 $\mu$m and a resistivity of 0.2–2 $\Omega$-cm. However, compromises must be made, because reducing the thickness and doping concentration of the zone 24a implies that the thickness and doping concentration of the simultaneously-formed zone 18a will also be reduced, and this reduces the breakdown voltage of the transistor 40.

It will be appreciated that the present invention is not restricted to the particular method and structure that have been described with reference to the drawings, and that variations may be made therein without departing from the scope of the invention as defined by the appended claims, and equivalents thereof. For example, the invention is not restricted to NPN transistors, and is applicable to PNP transistors also. Moreover, the invention is not restricted to the specific form of dielectric isolation between the collector contact region 22 and the active region of the transistor 42 that has been described, since other dielectric isolation techniques, such as trench and refill (See U.S. Pat. No. 4,160,991, for example) and mesa isolation may be used instead.

We claim:

1. An integrated circuit structure comprising a body of semiconductor material and at least first and second transistors formed in a spaced-apart relationship therein and defining a space therebetween at a surface thereof, said body of semiconductor material comprising a substrate and an epitaxial layer over predetermined surface regions of said substrate, said epitaxial layer being of substantially uniform thickness over said predetermined surface regions, said first transistor having a base, an emitter, an active collector and a collector contact region formed in the epitaxial layer and a subcollector formed in a region of the substrate beneath the base and active collector of the first transistor, and said second transistor having a base, an emitter and an active collector formed in said epitaxial layer, a collector contact region formed in said epitaxial layer and laterally spaced from the base and emitter of the second transistor, and a subcollector formed in a region of the substrate which extends beneath the base, the active collector and the collector contact region of the second transistor, the subcollector of the second transistor having a lower concentration of impurity than the subcollector of the first transistor and being separated by a predetermined distance therefrom.

2. An integrated circuit structure according to claim 1, wherein the region of the epitaxial layer in which the collector contact region of the second transistor is formed is separated from the region in which the base and the emitter of the second transistor are formed by a body of dielectic material.

3. An integrated circuit structure according to claim 2, wherein the substrate is made of silicon and said dielectric material is silicon dioxide.

4. An integrated circuit structure according to claim 1, wherein the substrate includes a highly-doped channel stop region in the space between the subcollectors of the first and second transistors.

5. An integrated circuit structure according to claim 4 wherein said channel stop region is formed by ion implanation followed by diffusion.

6. An integrated circuit structure according to claim 5 wherein said ion implantation is carried out using ions which include the boron atom.

7. An integrated circuit structure according to claim 4 wherein the second transistor has a breakdown voltage that is higher than the breakdown voltage of the first transistor.

* * * * *